(12) United States Patent
Brandl et al.

(10) Patent No.: US 8,140,009 B2
(45) Date of Patent: Mar. 20, 2012

(54) CIRCUIT AND DATA CARRIER WITH RADIO FREQUENCY INTERFACE

(75) Inventors: Roland Brandl, Eggersdorf bei Graz (AT); Ewald Bergler, Weiz (AT); Robert Spindler, Graz (AT)

(73) Assignee: NXP B.V., Eindhoven (NL)

( * ) Notice: Subject to any disclaimer, the term of this patent is extended or adjusted under 35 U.S.C. 154(b) by 538 days.

(21) Appl. No.: 12/158,112

(22) PCT Filed: Dec. 14, 2006

(86) PCT No.: PCT/IB2006/054838
§ 371 (c)(1),
(2), (4) Date: Jun. 19, 2008

(87) PCT Pub. No.: WO2007/072345
PCT Pub. Date: Jun. 28, 2007

(65) Prior Publication Data
US 2009/0045832 A1    Feb. 19, 2009

(30) Foreign Application Priority Data
Dec. 20, 2005  (EP) ..................... 05112528

(51) Int. Cl.
*H04B 7/00* (2006.01)
*H04B 17/00* (2006.01)
(52) U.S. Cl. ............... 455/41.1; 455/67.11; 455/115.1; 455/226.1; 714/733; 340/10.1

(58) Field of Classification Search ............... 455/41.1, 455/67.11, 115.1, 226.1; 714/733; 340/10
See application file for complete search history.

(56) References Cited

U.S. PATENT DOCUMENTS

| 6,721,912 B2 * | 4/2004 | Burger et al. ............... 714/733 |
| 2005/0193294 A1 | 9/2005 | Hildebrant |
| 2005/0240370 A1 * | 10/2005 | Diorio et al. ............... 340/10.51 |
| 2006/0197668 A1 * | 9/2006 | Oliver et al. ............... 340/10.34 |

FOREIGN PATENT DOCUMENTS

| DE | 10015484 C2 | 10/2002 |
| EP | 1251458 A2 | 10/2002 |

\* cited by examiner

*Primary Examiner* — Wen Huang

(57) ABSTRACT

A circuit (12) comprises a first circuit point (13) and a second circuit point (14), which first circuit point (13) and second circuit point (14) are designed to be connected with RF transmission means (11) being designed for receiving in a contactless manner a carrier signal (CS) from a read/write station and for feeding the circuit (12) with the received carrier signal (CS). The circuit (12) further comprises circuit testing means (4) being designed to carry out functional tests of the circuit (12) and to output a modulated response signal (TS-MOD) via the first and second circuit points (13, 14) only if the functional tests have been successful. The circuit (12) further comprises test trigger signal detecting means (5) being designed for detecting a test trigger signal (TS) that is applied across the first circuit point (13) and the second circuit point (14), wherein the test trigger signal detecting means (5) are designed to trigger the circuit testing means (4) to carry out the functional tests if they detect the test trigger signal (TS).

20 Claims, 3 Drawing Sheets

CIRCUIT AND DATA CARRIER WITH RADIO FREQUENCY INTERFACE

FIELD OF THE INVENTION

The invention relates to a circuit for a data carrier.

The invention further relates to a data carrier with a circuit according to the preceding paragraph.

BACKGROUND OF THE INVENTION

Recent developments in industry have shown that Radio Frequency Identification Systems (RFID-systems) are becoming an integrated part of logistics and transportation applications. On one hand such RFID-systems typically comprise at least one data carrier, which data carrier comprises an integrated circuit and transmission means that are connected to the integrated circuit. On the other hand such RFID-systems comprise a read/write station, also known as RFID reader, that provides a Radio Frequency (RF) carrier signal for the purpose of powering the integrated circuit of the data carrier and for exchanging data with said integrated data carrier by the aid of the RF carrier signal in a contactless manner. Due to increasing demand for long distance RFID-systems the domain of Ultra High Frequency (UHF) RFID-systems that operate up to the GHz frequency range is recently becoming very important for such logistics and transportation applications.

During manufacturing of said circuits and data carriers comprising the circuits it is necessary to carry out various functional tests. These functional tests comprise self-tests of the integrated circuits and the data carriers, respectively.

German patent DE 100 15 484 C2 discloses a test system for integrated circuits that are carried on a wafer wherein the self-tests of the circuits have to be carried out prior to separating the integrated circuits from the wafer. This known test system comprises a reading head that is adapted to send electromagnetic signals in a wireless manner to the integrated circuits in order to selectively activate them. When being activated the integrated circuits carry out the self-tests and reply to the testing head only if the self-tests have been successful. The testing heads evaluate the received replies.

The known test system, however, is only useful for testing integrated circuits before they are separated from the waver. Thus, it is not applicable after manufacturing steps of separating the integrated circuits from the waver, fixing them to a substrate and bonding them to an antenna have been carried out. In practice, this is a big disadvantage, since it has turned out that the manufacturing steps of separating the integrated circuits from the wafers and fixing them on a substrate are those with the highest risk for damaging the integrated circuits. Further, DE 100 15 484 C2 does not reveal any measures to trigger the self-tests of the integrated circuits. Specifically, this document does not suggest to use voltages that are different from the conventional RF electromagnetic signals to trigger self-tests of the integrated circuits. Further, the use of testing heads that transmit and receive RF electromagnetic signals require the use of relatively expensive test equipment for testing the integrated circuits.

OBJECT AND SUMMARY OF THE INVENTION

It is an object of the invention to provide a circuit of the type mentioned in the first paragraph and a data carrier of the type mentioned in the second paragraph, which obviate the drawbacks described hereinbefore.

To achieve the object described above, characteristic features according to the invention are provided with a circuit according to the invention, so that a circuit according to the invention can be characterized as follows:

A circuit comprising a first circuit point and a second circuit point, which first circuit point and second circuit point are designed to be connected with RF transmission means being designed for receiving in a contact-less manner an AC carrier signal from a read/write station and for feeding the circuit with the received carrier signal, wherein the circuit further comprises circuit testing means being designed to carry out functional tests of the circuit and to output a response signal via the first and second circuit points only if the functional tests have been successful, and test trigger signal detecting means being designed for detecting a direct current component of a test trigger signal that is applied across the first circuit point and the second circuit point, wherein the test trigger signal it either a pure DC signal or a signal that contains a DC component or an AC signal with a frequency that is at least one order of magnitude, preferably at least two orders of magnitude or more lower than the frequency of the carrier signal, wherein the test trigger signal detecting means are designed to trigger the circuit testing means to carry out the functional tests if they detect the test trigger signal.

To achieve the object described above, a data carrier according to the invention comprises a circuit according to the invention.

The provision of the characteristic features according to the invention provides the advantage that no radio frequency signal generating device is required in order to perform a proper self-test operation of the circuit and of the data carrier, respectively. In comparison to radio frequency signal based testing equipment the present invention allows to use significantly cheaper and simple test equipment for testing purposes, while at the same time no additional pads or connectors are required to perform chip testing operations and to connect the transmission means. In addition, the radio frequency (RF) operational mode of the integrated circuit is not affected by the design according to the invention because the measures according to the invention provide proper operation for radio frequency (alternate current) signals as well as for direct current signals that are fed into the circuit via the two connection pads of the circuit, which connection pads are typically used to be connected with the transmission means. Using direct current signals for testing purposes also provides high immunity against environmental noise.

Some solutions of the present invention provide the advantage that the input signal fed to the circuit is modulated if it has been detected as the test trigger signal and if the internal functional tests have been carried out with success. Thus, it is very easy to determine whether the data carrier and the circuit, respectively, are fully functional.

Some solutions according to the invention offer the advantage that a supply voltage for supplying electric power to the parts of the circuit that require to be powered can be generated not only based on an RF signal but also based on a direct current signal.

Other solutions according to the invention offer the advantage that the original design of the supply voltage generating means, which design was based on the concept of operating the circuit only by means of RF signals, does not have to be changed significantly in order to provide the second supply voltage. In a particular solution the DC decoupling means have to be bypassed by a diode or the like.

Other solutions according to the invention offer the advantage that the original design of rectifying means, which design was based on the concept of operating the circuit only by means of RF signals, can be maintained with the synergic effect that the various voltages appearing at the input or output or internally of the rectifying means can be used to detect the test trigger signal, since said voltages vary in dependence on whether the signal fed to the input of the rectifying means is an AC carrier signal or a test trigger voltage with a DC component or an AC test trigger signal having a frequency that is considerably lower than that of the AC carrier signal.

The aspects defined above and further aspects of the invention are apparent from the exemplary embodiment to be described hereinafter and are explained with reference to this exemplary embodiment.

BRIEF DESCRIPTION OF THE DRAWINGS

The invention will be described in more detail hereinafter with reference to exemplary embodiments. However, the invention is not limited to these exemplary embodiments.

DESCRIPTION OF EMBODIMENTS

Figure 1:
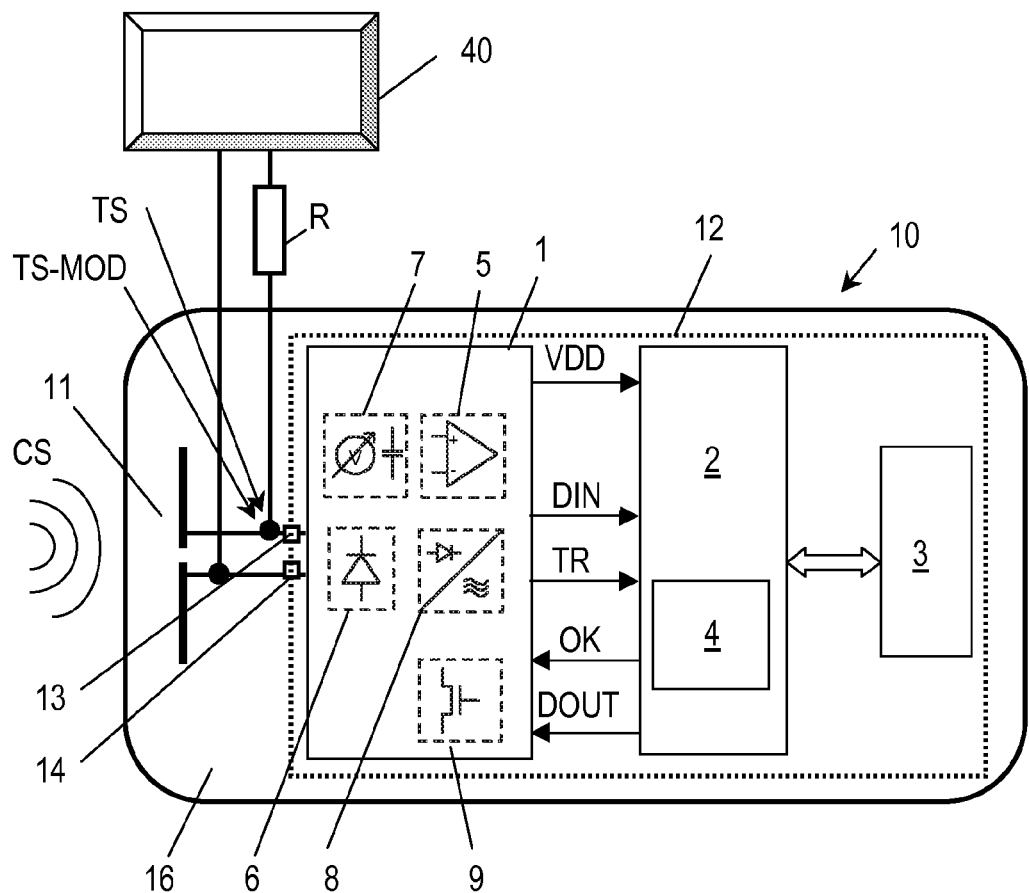
FIG. 1 shows schematically in form of a block diagram a data carrier comprising a circuit according to the invention.

FIG. 1 shows a schematic block circuit diagram of a general embodiment of a data carrier 10 according to the invention, which data carrier 10 comprises an integrated circuit 12 according to the invention, wherein the integrated circuit 12 is positioned on a substrate 16. The data carrier 10 is configured as a passive transponder and comprises RF transmission means 11 in form of an antenna positioned on the substrate 16, which antenna is designed for receiving in a contact-less manner an electromagnetic RF carrier signal CS from a read/write station not depicted in the drawing. The carrier signal CS can, for instance, have a frequency in the range from a few kHz up to GHz.

The RF transmission means 11 are connected to the circuit 12 by means of a first circuit point 13 and a second circuit point 14, which may be configured as connection pads that are wired to the circuit 12. The connection pads may be configured as so called "gold-bumps", i.e. raised contact-pads that are coated with a thin layer of gold. In practice, a plurality of circuits 12 are manufactured on a common wafer. After finishing the manufacturing steps of the circuits 12 on the waver some functional tests are carried out with the circuits. Then the circuits 12 are separated from the wafer. Separating the circuits from the waver is a dangerous step in manufacturing data carriers, hence, after the separating step has been carried out one cannot any longer rely on the previous functional tests.

After separating the circuits 12 they may be adhered to a carrier having small metal stripes that are already connected with the RF pads, in order to provide an intermediary product that can be distributed to end manufacturers.

Next, a substrate 16, like a foil or sheet of plastics, is provided onto which the circuit 12 is affixed, either directly after having been separated from the waver or in form of said intermediary product.

In a further manufacturing process the transmission means 11 in form of an antenna are provided on the substrate 16. This may be carried out either before affixing the circuit 12 or thereafter. Providing the transmission means 11 on the substrate 16 may e.g. be accomplished by applying a paste of electrically conducting material in a predefined pattern onto the substrate 16. Finally, the transmission means 11 and the circuit 12 are connected with each other, e.g. by pressing the circuit 12 onto the substrate 16 so that the terminals of the transmission means 11 touch the connection pads in an electrically conducting manner, or—when the circuit 12 has been affixed to the substrate prior to forming the transmission means—by bonding the terminals of the transmission means 11 with the terminals of the circuit 12. Finally, the circuit 12 may be covered with a protection layer.

Pressing the circuit 12 onto the substrate 16 is the most dangerous step in manufacturing the data carrier 10 and it is unavoidable to again carry out various tests with the data carrier 10 after said pressing step in order to check its proper function.

For instance, when the RF transmission means 11 are configured as a so-called open loop dipole antenna a first inner end of the dipole antenna is connected with the connection pad of the first circuit point 13 and a second inner end of the dipole antenna is connected with the connection pad of the second circuit point 14.

The first circuit point 13 and the second circuit point 14 of the circuit 12 are wired with an analogue radio frequency interface 1 so that a carrier signal CS that is transmitted from the read/write station to the RF transmission means is fed to an analogue radio frequency interface 1. The analogue radio frequency interface 1 is connected to a digital control unit 2, which is connected to a memory 3. In this exemplary embodiment, the memory 3 is a non-volatile memory, like an EEPROM, so that data that are written into the memory 3 during communication with the read/write station remain stored even when the data carrier 10 is switched off, e.g. because it leaves the transmitting range of the read/write station and is therefore not longer energized. Memory 3 may also contain program code for operating the digital control unit 2 and a unique identification number.

The carrier signal CS is processed in the analogue radio frequency interface 1 in various ways. In general, the analogue radio frequency interface 1 comprises rectifying means 6 and supply voltage generating means 7, wherein the rectifying means 6 and the supply voltage generating means 7 may be an integrated component. The rectifying means 6 rectify the carrier signal CS and the supply voltage generating means 7 derive from the carrier signal CS an operating voltage VDD for powering the digital control unit 2 and the memory 3.

Further, the analogue radio frequency interface 1 comprises a demodulator 8 being adapted to extract input data DIN from the carrier signal CS and to pass the input data DIN to the digital control unit 2. The input data DIN may contain instructions, identification data and the like. Digital control unit 2 processes the received input traffic data DIN and—in normal operation mode—may respond to the read/write station by creating output data DOUT.

The analogue radio frequency interface 1 further comprises modulating means 9 that receive the output data DOUT as a control signal and modulate the carrier signal CS by load modulation according to the signal pattern of output data DOUT.

It should be observed that the configuration of the data carrier 10 as hitherto described is a conventional one and has been merely described for a comprehensive understanding of the present invention. However, those skilled in the art will be aware that this configuration may be varied in various ways.

According to the invention—and deviating from conventional designs of data carriers—the circuit 12 also comprises circuit testing means 4 being designed to carry out functional tests of the circuit 12 and to output a response signal OK via the first and second circuit points 13, 14 only if the functional tests have been successful. The circuit testing means 4 may be incorporated into the digital control unit 2, but they may also be configured as a separate unit or as a unit that comprises components in both the analogue radio frequency interface 1 and the digital control unit 2. The circuit 12 further comprises test trigger signal detecting means 5 that are designed to detect a test trigger signal TS that is applied by a testing device 40 via a series resistor R across the first circuit point 13 and the second circuit point 14. The test trigger signal TS it either a pure DC signal or a signal that contains a DC component or an AC signal with a frequency that is at least one order of magnitude, preferably at least two orders or more lower than the frequency of the carrier signal CS. For instance, if the carrier signal CS is an AC signal with a frequency of 868 MHz it is preferred that the test trigger signal TS if configured as an AC signal has a frequency of 10 MHz or below. By this definition the test trigger signal TS clearly distinguishes from the carrier signal CS which is usually a pure alternating current (AC) signal with a high frequency. Hence, the test trigger signal detecting means 5 are configured to detect either a DC signal or a signal with a DC component or an AC signal with a low frequency at the first and second circuit points 13, 14. If the test trigger signal detecting means 5 detect the test trigger signal TS they output a trigger signal TR to the circuit testing means 4, which trigger signal TR triggers the circuit testing means 4 to start the functional tests.

Figure 2:
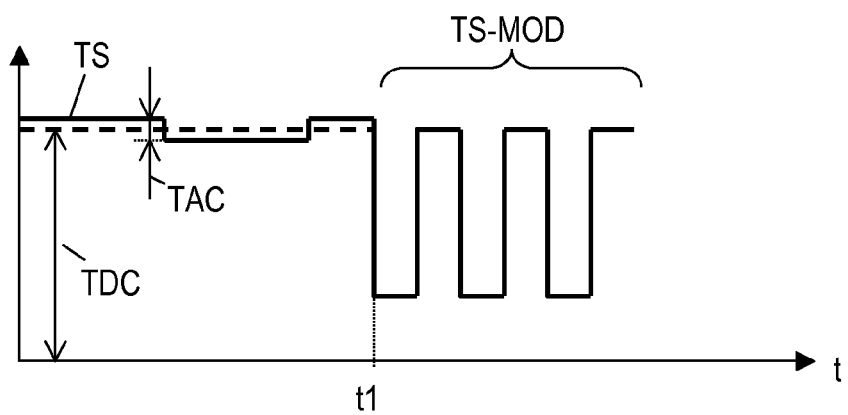
FIG. 2 shows a test trigger signal and a modulated test trigger signal representing a modulated response signal.

Now referring to FIG. 2 an example of a test trigger signal TS is explained. The exemplary test trigger signal TS is a composite signal that comprises a predominant DC component TDC and a small AC component TAC with a low frequency. For instance, the AC component TAC may be caused by ripple noise.

Figure 3:
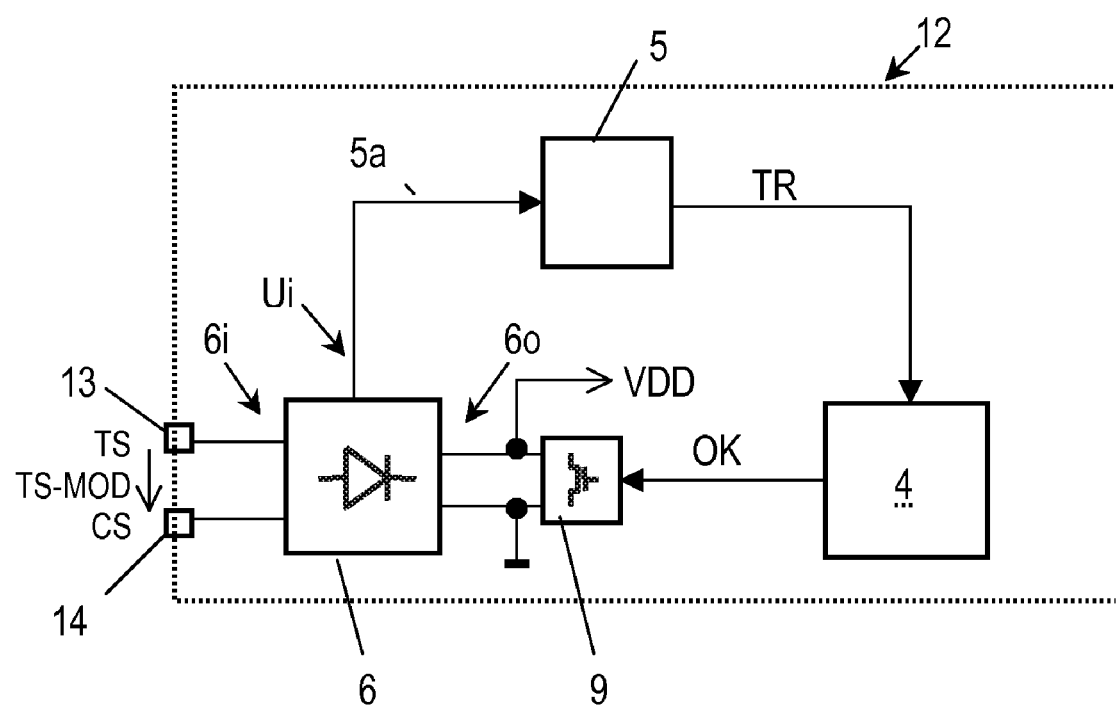
FIG. 3 shows schematically in form of a block diagram a specific configuration of the circuit according to the invention.

Next, with reference to FIG. 3 a schematic configuration of the circuit 12 of the data carrier 10 is explained, wherein for the sake of clarity in FIG. 3 only those components are shown that are essential for the present invention, whereas other components that have already been explained in respect of FIG. 1 have been omitted.

In the configuration that is schematically shown in FIG. 3 the first and second circuit points 13, 14 of the circuit 12 are connected to the input 6i of the rectifying means 6. The output 6o of the rectifying means 6 delivers a supply voltage VDD in respect of a reference potential. The test trigger signal detecting means 5 are configured to tap via line 5a internal voltages Ui of the rectifying means 6 and to treat and examine this internal voltages Ui in order to find out whether the signal applied to the first and second circuit points 13, 14 meets the conditions for the test trigger signal TS, i.e. it is either a DC signal or a signal with a predominant DC signal component or an AC signal with a low frequency. Treating and examining the internal voltages Ui may either comprise comparing this internal voltages Ui with other internal voltages of the circuit or calculating an average value, a root mean square value, a peak value or the like of the internal voltages Ui and evaluating the results of said calculations, e.g. by comparison with predefined threshold values. Since rectifying means generally contain signal shaping elements, like diodes, and energy storing elements, like capacitors or inductors, it is clear to those skilled in the art that the voltages appearing at said electric elements will change in dependence on the shape, amplitude and frequency of the signal applied to the input of the rectifying means. Thus, it will be appreciated that by tapping internal voltages Ui of the rectifying means 6 at said internal electric elements it is possible to evaluate whether the signal appearing at the input 6i is a high-frequency AC carrier signal CS, or a test trigger signal TS with the signal properties mentioned above. Hence, if a test trigger signal TS is applied to the first and second circuit points 13, 14, the test trigger signal detecting means 5 will detect it and will output a trigger signal TR to the circuit testing means 4, which will then commence to carry out functional tests of the circuit 12. If all functional tests are successful, the circuit testing means 4 will output a response signal OK that causes a modulation performed by the modulating means 9 which are connected to the output 6o of the rectifying means 6. The modulating means 9 will modulate the test trigger signal TS being applied to the first and second circuit points 13, 14 such that the modulated signal represents a modulated response signal TS-MOD. Again referring to the diagram of FIG. 2 it can be seen that at the time t1 the circuit testing means 4 have obviously successfully completed the functional tests, and thus the modulated response signal TS-MOD is sent across the first and second circuit points 13, 14. This modulated test trigger signal TS-MOD is evaluated by the testing device 40 in wire-conducted manner (see FIG. 1).

It should be mentioned that in the configuration of FIG. 3 the rectifying means 6 could be replaces by integrated rectifying and supply voltage generating means. Further, the modulating means 9 can be switched between the first and second circuit points 13, 14.

Figure 4:
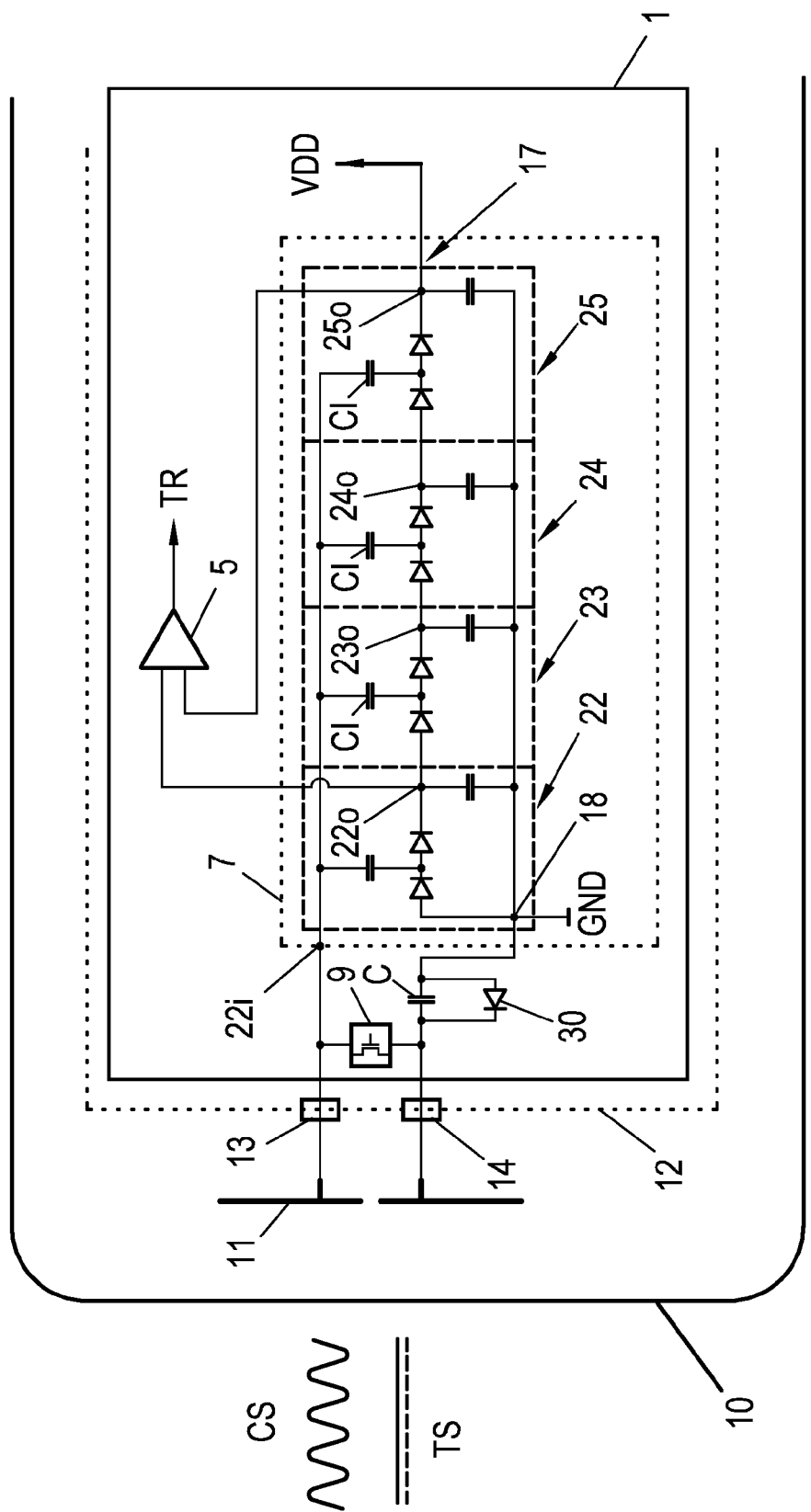
FIG. 4 shows in form of a circuit diagram of an analogue radio frequency interface of the circuit according to FIG. 1.

Now with reference to FIG. 4 the analogue radio frequency interface 1 of the circuit 12 of the data carrier 10 according to FIG. 1 is explained in detail. The analogue radio frequency interface 1 is connected to the transmission means 11 via the first and second circuit point 13, 14 that are established as connection pads 13.

The analogue radio frequency interface 1 comprises modulating means 9 that are connected to the first circuit point 13 and the second circuit point 14, respectively.

The analogue radio frequency interface 1 of the circuit 12 comprises supply voltage generating means 7 that are designed for generating based on an input voltage at the first and second circuit point 13, 14 a supply voltage VDD at a supply voltage circuit point 17 with reference to a reference potential GND at reference potential circuit point 18. The analogue radio frequency interface 1 further comprises a capacitor C that is connected between the second circuit point 14 and the reference potential circuit point 18. The capacitor C acts as an alternate current (AC) short-circuit against the reference potential, or in other words, as a DC decoupling means.

The supply voltage generating means 7 are realized as a multi stage charge pump comprising a first charge pump stage 22, a second charge pump stage 23, a third charge pump stage 24 and a fourth charge pump stage 25. The first charge pump stage 22 comprises a first input 22i that is connected to the first circuit point 13. The first charge pump stage 22 is also connected to the reference potential circuit point 18. The first charge pump further comprises a first output 22o. Each of the remaining charge pumps 23, 24 and 25 comprise an input and an output 23o, 24o and 25o as described herein below. The charge pump stages 22, 23, 24 and 25 are connected in series to each other. In this series connection the first output 22o of the first charge pump stage 22 forms a second input of the second charge pump 23, the second output 23o of the second charge pump stage 23 forms a third input of the third charge pump stage 24, the third output 24o of the third charge pump stage 24 forms a fourth input of the fourth charge pump stage 25, which fourth charge pump stage 25 comprises the fourth output 25o. The fourth output 25o realizes the supply voltage circuit point 17.

The analogue radio frequency interface 1 further comprises current conducting means 30 that are connected in parallel to the capacitor C. The current conducting means 30 are designed for the unidirectional conducting of current in direction from the reference potential circuit point 18 to the second circuit point 14. In this embodiment the current conducting means 30 are realized by a diode, which diode is connected at its anode with the reference potential circuit point 18 and at its cathode with the second circuit point 14.

Providing the above-described measures the analogue radio frequency interface 1 allows a signal with a direct current component, like the test trigger signal TS shown in FIG. 2, to be fed into the circuit 12 in contacting manner via the first and second circuit points 13, 14 in order to operate the circuit 12 as it would be operated in case of having the RF carrier signal CS received via the transmission means 11 of the data carrier 10. In operation the current conducting means 30 allow a direct current flow between the first circuit point 13 and the second circuit point 14 by means of bypassing the capacitor C, which capacitor C basically does not allow any direct current to pass. However, the radio frequency operation of the circuit 12 is not interfered as the diode is short-circuited for high frequencies by the aid of the capacitor C. In this context the operation of the data carrier 10, in which the circuit 12 receives the RF carrier signal CS and utilizes it to be supplied with power is called the "RF operation". It should be mentioned that when the test trigger signal TS is fed to the supply voltage generating means 7 they will also generate the supply voltage VDD, although the value of the supply voltage VDD may differ in dependence on the shape of the signal fed to the input of the supply voltage generating means 7. The reason for this behavior is that the supply voltage generating means 7 consists of serially connected charge pump stages 22-25. A charge pump when receiving an AC signal at its input provides an output signal with a higher amplitude. However, when the charge pump is fed with a DC signal at its input it will generate a voltage with reduced amplitude at its output due to the various voltage drops at its internal diode means. This effect is used to detect the test trigger signal TS by the test trigger signal detecting means 5. For this purpose, the test trigger signal detecting means 5 are configured as a comparator one input line of which is connected to the output 22o of the first charge pump stage 22 and the other input line of which is connected to the output 25o of the fourth charge pump stage 25. If the signal appearing at the first and second circuit point 13, 14 is the test trigger signal TS the voltage tapped at the output 22o of the first charge pump stage 22 will be higher than the voltage tapped at the output 25o of the fourth charge pump stage 25. The test trigger signal detecting means 5 detect this difference and generate the trigger signal TR. In case that the AC carrier signal CS is applied to the first and second circuit points 13, 14 the voltage tapped at the output 25o of the fourth charge pump stage 25 will be higher than the voltage tapped at the output 22o of the first charge pump stage 25. In this case the test trigger signal detecting means 5 will not generate a trigger signal TR.

In order to guarantee for relatively low losses when passing the direct current signal through the supply voltage generating means 7, the first charge pump stage 22 shows a design that is slightly different from the other charge pump stages 23, 24 and 25. In contrast to the charge pump stages 23, 24 and 25 the input capacitor CI shown in the charge pump stages 23, 24 and 25 has been removed from the first charge pump stage 22 and the first charge pump stage 22 comprises only the rectifier structure realized by diodes, wherein a capacitor is connected in parallel with the rectifier structure to the first output 22o, as shown in FIG. 5.

Although in the described embodiments of the invention the direct current conducting means 30 have been described as general diode it can be mentioned that also a particular diode like a so called "Schottky" diode or a transistor that is operated as a diode can be utilized to realize the direct current conducting means. Also other electronic components having the appropriate properties are considered as being comprised for those skilled in the art knowing the teaching of this invention.

It can be mentioned that in a further embodiment the direct coupling decoupling means (C) can also be located between the first circuit point (13) and the input of the supply voltage generating means (7) and that the current conducting means (30) are connected in parallel connection to the direct current decoupling means (C) in order to allow a direct current flow from the first circuit point (13) through the supply voltage generating means (7) to the second circuit point (14).

It can also be mentioned that in a further embodiment more than one antenna is provided and that one common ground pad is utilized for the purpose of applying the teaching of the present invention.

The invention claimed is:

1. A circuit comprising:
a first circuit point;
a second circuit point; wherein the first circuit point and second circuit point are connected to a radio frequency (RF) transmission means, and the RF transmission means receives, in a contact-less manner, an alternating current (AC) carrier signal from a read/write station and feeds the circuit with the received AC carrier signal;
a circuit testing means that carries out functional tests of the circuit, wherein the circuit testing means outputs a response signal via the first circuit point and the second circuit point only if the functional tests have been successful; and
a test trigger signal detecting means, wherein the test trigger signal detecting means detects a direct current (DC) component of a test trigger signal that is applied across the first circuit point and the second circuit point, and triggers the circuit testing means to carry out the functional tests upon detection of the test trigger signal.

2. The circuit as claimed in claim 1, further comprising:
a modulating means that modulates a signal appearing at the first circuit point and the second circuit point, wherein the circuit testing means control the modulating means by sending a response signal with a predefined signal pattern if the functional tests have been successful.

3. The circuit as claimed in claim 1, further comprising:
a supply voltage generating means, wherein the supply voltage generating means receives the AC carrier signal and the test trigger signal from the first circuit point and the second circuit point, and is realized by means of a multi-stage charge pump, the test trigger signal detecting means compares output voltages of two stages of the multi-stage charge pump and detects the test trigger signal if the output voltage of a subsequent charge pump stage is lower than the output voltage of a preceding charge pump stage.

4. The circuit as claimed in claim 1, further comprising:
a voltage rectifying means connected to the first circuit point and the second circuit point that rectifies the carrier signal, wherein the test trigger signal detecting means, in order to detect the DC component of the test trigger signal, evaluates at least one signal parameter, wherein said at least one signal parameter has different values depending on whether a signal applied to the first circuit point and the second circuit point is the AC carrier signal or the test trigger signal.

5. The circuit as claimed in claim 1, further comprising:
a DC decoupling means, wherein the DC decoupling means inhibits a DC flow between the second circuit point and a reference potential circuit point.

6. The circuit of claim 5, wherein the DC decoupling means is a capacitor.

7. The circuit of claim 5, wherein the DC decoupling means connects the first circuit point to an input of a supply voltage generating means.

8. The circuit of claim 1, wherein the RF transmission means is an antenna positioned on a substrate and the circuit is also positioned on the substrate.

9. The circuit of claim 1, wherein the first circuit point and the second circuit point are connection pads wired to the circuit.

10. The circuit of claim 9, wherein the connection pads are raised contact pads coated with a thin layer of gold.

11. The circuit of claim 1, further comprising:
current conducting means that unidirectionally conduct a DC current from a reference potential circuit point to the second circuit point.

12. The circuit of claim 11, wherein the current conducting means is a diode.

13. The circuit of claim 11, wherein the current conducting means is a transistor operated as a diode.

14. The circuit of claim 11, wherein the current conducting means allows a DC flow between the first circuit point and the second circuit point by bypassing a capacitor.

15. The circuit of claim 11, wherein the current conducting means allows a DC flow between the first circuit point and the second circuit point through a supply voltage generating means.

16. The circuit of claim 1, wherein the test trigger signal is applied via a series resistor between the first circuit point and the second circuit point.

17. The circuit of claim 1, wherein the test trigger signal is a pure DC signal.

18. The circuit of claim 1, wherein the test trigger signal is an AC signal having a frequency at least two orders of magnitude lower than a frequency of an AC carrier signal.

19. The circuit of claim 1, wherein the test trigger signal is a composite signal comprising the DC component and AC ripple noise.

20. A circuit comprising:
a first circuit point;
a second circuit point; wherein the first circuit point and second circuit point are connected to a RF transmission means, and the RF transmission means receives, in a contact-less manner, an AC carrier signal from a read/write station and feeds the circuit with the received AC carrier signal;
a circuit testing means that carries out functional tests of the circuit, wherein the circuit testing means outputs a response signal via the first circuit point and the second circuit point only if the functional tests have been successful;
a test trigger signal detecting means, wherein the test trigger signal detecting means detects a direct current component of a test trigger signal that is applied across the first circuit point and the second circuit point, and triggers the circuit testing means to carry out the functional tests upon detection of the test trigger signal; and
a supply voltage generating means, wherein the supply voltage generating means receives the AC carrier signal and the test trigger signal from the first circuit point and the second circuit point, provides a supply voltage circuit point and a reference potential circuit point, and is realized by means of a multi-stage charge pump, each charge pump stage comprises an input, an output, and circuitry between the input and the output that increases an AC voltage applied to the input and delivers the increased AC voltage to the output, the input of a subsequent charge pump stage is connected to the output of a preceding charge pump stage, the output of a last charge pump stage provides the supply voltage circuit point, the test trigger signal detecting means compares output voltages of the preceding charge pump stage and the subsequent charge pump stage and detects the test trigger signal if the output voltage of the subsequent charge pump stage is lower than the output voltage of the preceding charge pump stage.

* * * * *